United States Patent
Okada

(10) Patent No.: US 12,431,869 B2
(45) Date of Patent: Sep. 30, 2025

(54) ACOUSTIC WAVE FILTER AND COMPOSITE FILTER DEVICE

(71) Applicant: Murata Manufacturing Co., Ltd., Nagaokakyo (JP)

(72) Inventor: Keiji Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 291 days.

(21) Appl. No.: 18/196,520

(22) Filed: May 12, 2023

(65) Prior Publication Data

US 2023/0283262 A1    Sep. 7, 2023

Related U.S. Application Data

(63) Continuation of application No. PCT/JP2021/041750, filed on Nov. 12, 2021.

(30) Foreign Application Priority Data

Nov. 18, 2020  (JP) .................. 2020-191895

(51) Int. Cl.
  *H03H 9/64*   (2006.01)
  *H03H 9/00*   (2006.01)
  (Continued)

(52) U.S. Cl.
  CPC ........ *H03H 9/6483* (2013.01); *H03H 9/0009* (2013.01); *H03H 9/145* (2013.01); *H03H 9/725* (2013.01)

(58) Field of Classification Search
  CPC ...... H03H 9/6483; H03H 9/725; H03H 9/145; H03H 9/64; H03H 9/6433; H03H 9/02574;
  (Continued)

(56) References Cited

U.S. PATENT DOCUMENTS 9,712,139 B2 *  7/2017  Taniguchi ............ H03H 9/6426
2004/0075362 A1  4/2004  Inoue et al.
(Continued)

FOREIGN PATENT DOCUMENTS

JP    09205343 A    8/1997
JP    2010109417 A  5/2010
(Continued)

OTHER PUBLICATIONS

International Search Report in PCT/JP2021/041750, mailed Jan. 11, 2022, 3 pages.
(Continued)

Primary Examiner — Lincoln D Donovan
Assistant Examiner — Tyler J Pereny
(74) Attorney, Agent, or Firm — Keating & Bennett, LLP

(57) ABSTRACT

An acoustic wave filter includes an input end, an output end, and a series arm connecting the input end and the output end. The series arm includes n (n=3) acoustic wave resonators connected in series in an order of first, second, and third acoustic wave resonators. The first, second, and third acoustic wave resonators include multiple electrode fingers. The first, second, and third acoustic wave resonators include an mth acoustic wave resonator (m is a natural number of 1<m<n, where m=2). An electrode finger pitch of the second acoustic wave resonator is smallest among electrode finger pitches of the first, second, and third acoustic wave resonators.

18 Claims, 15 Drawing Sheets

(51) Int. Cl.
*H03H 9/145* (2006.01)
*H03H 9/72* (2006.01)

(58) Field of Classification Search
CPC .. H03H 9/02834; H03H 9/02992; H03H 9/54; H03H 9/72; H03H 9/02559; H03H 9/25; H03H 9/6426; H03H 9/02929; H03H 9/14541; H03H 9/1457; H03H 9/205; H03H 9/568

See application file for complete search history.

(56) References Cited

U.S. PATENT DOCUMENTS

| | | | |
|---|---|---|---|
| 2013/0154763 A1* | 6/2013 | Takamine | H03H 9/725 333/195 |
| 2018/0069529 A1 | 3/2018 | Bi et al. | |
| 2019/0149312 A1* | 5/2019 | Takamine | H03H 9/02574 370/273 |
| 2020/0153411 A1 | 5/2020 | Mukai | |

FOREIGN PATENT DOCUMENTS

| | | |
|---|---|---|
| JP | 2018038040 A | 3/2018 |
| JP | 2020078048 A | 5/2020 |
| WO | 03096533 A1 | 11/2003 |

OTHER PUBLICATIONS

Written Opinion in PCT/JP2021/041750, mailed Jan. 11, 2022, 4 pages.

* cited by examiner

ACOUSTIC WAVE FILTER AND COMPOSITE FILTER DEVICE

CROSS REFERENCE TO RELATED APPLICATIONS

This application claims the benefit of priority to Japanese Patent Application No. 2020-191895 filed on Nov. 18, 2020 and is a Continuation Application of PCT Application No. PCT/JP2021/041750 filed on Nov. 12, 2021. The entire contents of each application are hereby incorporated herein by reference.

BACKGROUND OF THE INVENTION

1. Field of the Invention

The present invention relates to an acoustic wave filter including first, second, and third acoustic wave resonators connected in series, and a composite filter device.

2. Description of the Related Art

Hitherto, various acoustic wave filters including multiple acoustic wave resonators have been proposed. In an acoustic wave filter disclosed in Japanese Unexamined Patent Application Publication No. 09-205343 below, multiple resonators having the same electrode finger pitch and connected in series are provided. According to Japanese Unexamined Patent Application Publication No. 09-205343, a series arm resonator is split into multiple resonators connected in series, thus enhancing electric power handling capability.

SUMMARY OF THE INVENTION

Deterioration of electric power handling capability of an acoustic wave resonator is caused by a large displacement in a frequency range from a resonant frequency to an anti-resonant frequency during power application. In particular, local heat generation due to high voltage at the anti-resonant frequency causes electrochemical migration, thus lowering the electric power handling capability.

According to Japanese Unexamined Patent Application Publication No. 09-205343, the series arm resonator is split into multiple resonators connected in series to improve the electric power handling capability, but the electric power handling capability is still insufficient. In particular, in recent years, as demand for higher frequency has increased, a distance between electrode fingers has been shortened, which requires further improvement in the electric power handling capability.

Preferred embodiments of the present invention provide acoustic wave filters and composite filter devices that each can achieve enhanced electric power handling capability.

In a broad aspect of an acoustic wave filter according to a preferred embodiment of the present invention, the acoustic wave filter includes an input end, an output end, and a series arm connecting the input end and the output end. The series arm includes n acoustic wave resonators connected in series in an order of first, second, to nth acoustic wave resonators, where n is a natural number. Each of the n acoustic wave resonators includes multiple electrode fingers. The n acoustic wave resonators include an mth acoustic wave resonator, where m is a natural number of $1<m<n$. The mth acoustic wave resonator is interposed between the first and nth acoustic wave resonators. An electrode finger pitch of the mth acoustic wave resonator is smallest among electrode finger pitches of the n acoustic wave resonators.

In another broad aspect of an acoustic wave filter according to a preferred embodiment of the present invention, the acoustic wave filter includes an input end, an output end, a series arm connecting the input end and the output end, and a parallel arm connecting the series arm and a ground potential. The parallel arm includes n acoustic wave resonators connected in series in an order of first, second, to nth acoustic wave resonators, where n is a natural number. Each of the n acoustic wave resonators includes multiple electrode fingers. The n acoustic wave resonators include an mth acoustic wave resonator, where m is a natural number of $1<m<n$. The mth acoustic wave resonator is interposed between the first and nth acoustic wave resonators. An electrode finger pitch of the mth acoustic wave resonator is largest among electrode finger pitches of the n acoustic wave resonators.

A composite filter device according to a preferred embodiment of the present invention includes an acoustic wave filter according to another preferred embodiment of the present invention and at least one band-pass filter with a pass band different from a pass band of the acoustic wave filter. One end of the acoustic wave filter and one end of the at least one band-pass filter are connected in common.

Acoustic wave filters and composite filter devices according to preferred embodiments of the present invention can achieve enhanced electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

It should be noted that the preferred embodiments described herein are merely examples, and partial replacement or combination of elements or features is possible between different preferred embodiments.

Figure 1:
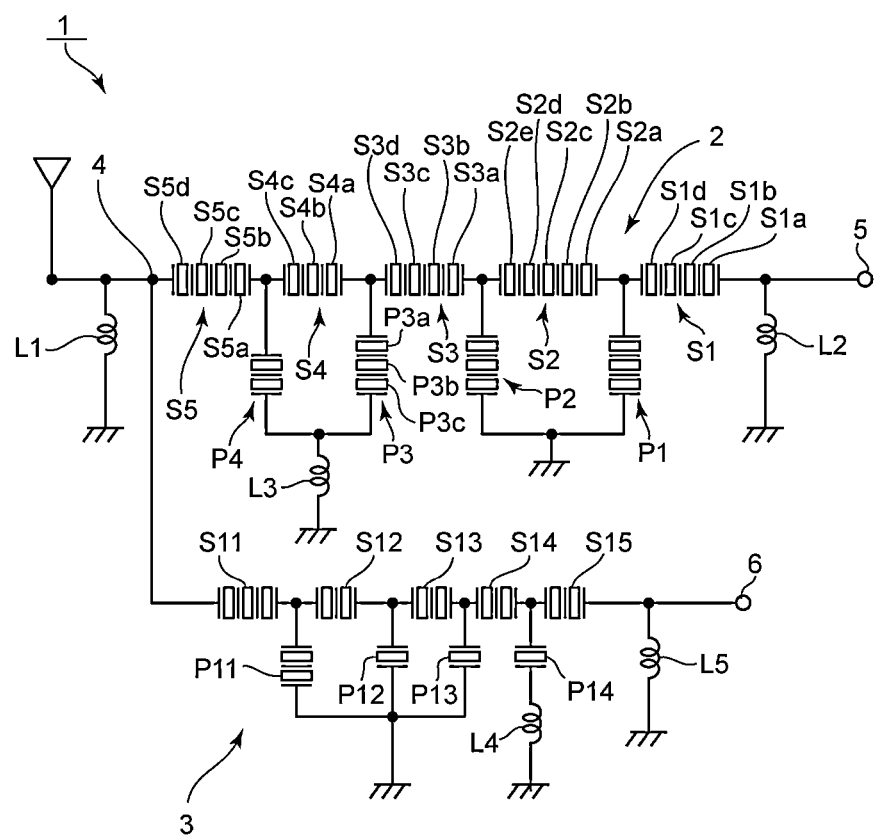
FIG. 1 is a circuit diagram of a composite filter device including an acoustic wave filter according to a first preferred embodiment of the present invention.
Figure 3:
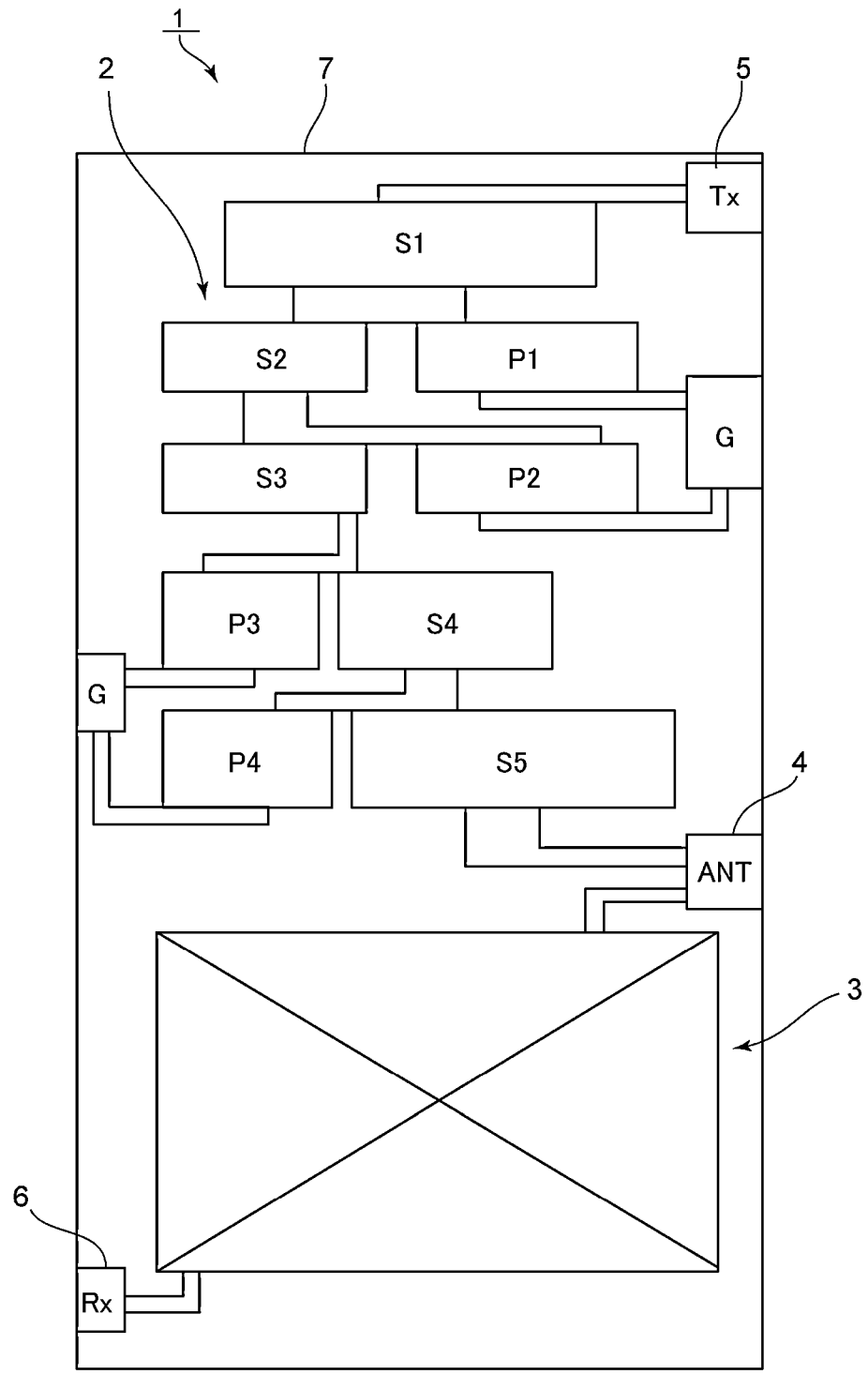
FIG. 3 is a schematic plan view of the composite filter device including the acoustic wave filter according to the first preferred embodiment of the present invention.

FIG. 1 is a circuit diagram of a composite filter device including an acoustic wave filter according to a first preferred embodiment of the present invention, and FIG. 3 is a schematic plan view of the composite filter device.

The composite filter device 1 includes a common terminal 4 that is connected to an antenna. An inductor L1 for impedance adjustment is connected between the common terminal 4 and a ground potential.

An acoustic wave filter 2 according to the first preferred embodiment of the present invention is connected between the common terminal 4 and a transmission terminal 5. The acoustic wave filter 2 is a transmission filter. Therefore, the transmission terminal 5 is an input end, and the common terminal 4 is an output end.

An acoustic wave filter 3 as a reception filter is connected between the common terminal 4 and a reception terminal 6.

In the acoustic wave filter 2, series arm resonators S1 to S5 are provided in a series arm connecting the transmission terminal 5 and the common terminal 4. In multiple parallel arms connecting the series arm and the ground potential, parallel arm resonators P1 to P4 are provided.

The parallel arm resonator P1 is connected between a connection point between the series arm resonator S1 and the series arm resonator S2 and the ground potential. The parallel arm resonator P2 is connected between a connection point between the series arm resonator S2 and the series arm resonator S3 and the ground potential. Ground potential side end portions of the parallel arm resonators P1 and P2 are connected in common to the ground potential. The parallel arm resonator P3 is connected between a connection point between the series arm resonator S3 and the series arm resonator S4 and the ground potential. The parallel arm resonator P4 is connected between a connection point between the series arm resonator S4 and the series arm resonator S5 and the ground potential. Ground potential side end portions of the parallel arm resonator P3 and the parallel arm resonator P4 are connected in common to the ground potential via an inductor L3.

An inductor L2 is connected between the transmission terminal 5 and the ground potential.

In the acoustic wave filter 2, each of the series arm resonators S1 to S5 and the parallel arm resonators P1 to P4 has a structure in which an acoustic wave resonator is split into multiple acoustic wave resonators connected in series in order to enhance the electric power handling capability. That is, each of the resonators includes multiple split resonators. To be more specific, of the series arm resonators S1 to S5, the series arm resonator S1 includes acoustic wave resonators S1a to S1d, the series arm resonator S2 includes acoustic wave resonators S2a to S2e, the series arm resonator S3 includes acoustic wave resonators S3a to S3d, the series arm resonator S4 includes acoustic wave resonators S4a to S4c, and the series arm resonator S5 includes acoustic wave resonators S5a to S5d.

Each of the parallel arm resonators P1 to P3 has a structure in which three acoustic wave resonators are connected in series, and the parallel arm resonator P4 has a structure in which two acoustic wave resonators are connected in series.

As illustrated in FIG. 3, in the composite filter device 1, the acoustic wave filters 2 and 3 are disposed on a piezoelectric substrate 7. To be more specific, IDT electrodes and reflectors constituting the series arm resonators S1 to S5 and the parallel arm resonators P1 to P4 are provided on the piezoelectric substrate 7. In the acoustic wave filter 3 side, similarly, IDT electrodes and reflectors of the acoustic wave resonators are provided. In FIG. 3, only the position where the acoustic wave filter 3 is disposed is illustrated schematically.

Figure 4:
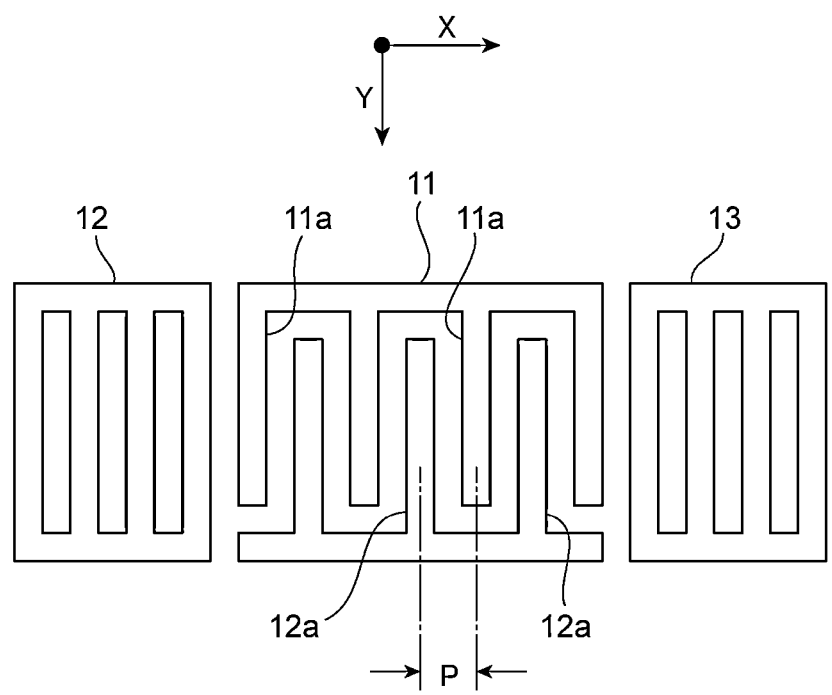
FIG. 4 is a plan view for explaining an electrode structure of an acoustic wave resonator.

FIG. 4 is a plan view illustrating an electrode structure of an acoustic wave resonator. In the acoustic wave resonator, reflectors 12 and 13 are disposed on both sides of an IDT electrode 11 in an acoustic wave propagation direction. Here, the IDT electrode 11 includes multiple first electrode fingers 11a and multiple second electrode fingers 12a that are interdigitated with each other. An electrode finger pitch P is a center-to-center distance between the adjacent first electrode finger 11a and second electrode finger 12a. In this specification, an electrode finger pitch for comparison between acoustic wave resonators is an average electrode finger pitch in each acoustic wave resonator. In FIG. 4, X is the acoustic wave propagation direction, which is a direction orthogonal to a direction in which the first and second electrode fingers 11a and 12a extend, and Y is a direction orthogonal to the acoustic wave propagation direction.

Figure 5:
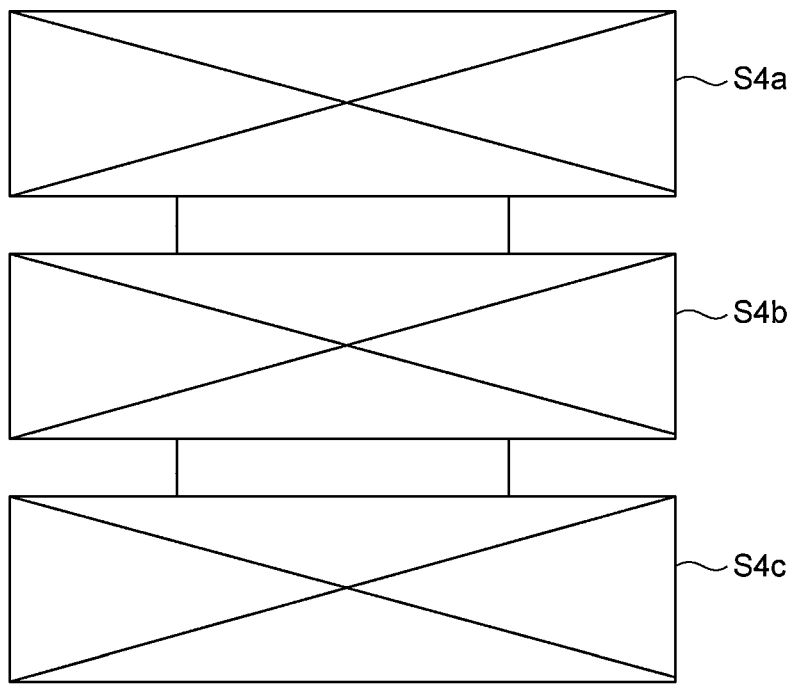
FIG. 5 is a schematic plan view for explaining a positional relationship between first to third acoustic wave resonators in the acoustic wave filter of the first preferred embodiment of the present invention.

As illustrated in FIG. 5, first to third acoustic wave resonators S4a to S4c are arranged in the Y direction, that is, the direction orthogonal to the acoustic wave propagation direction X. In the Y direction, the second acoustic wave resonator S4b is interposed between the first and third acoustic wave resonators S4a and S4c.

One feature of the acoustic wave filter 2 is that electrode finger pitches of the acoustic wave resonators S4a to S4c are different in the series arm resonator S4. To be more specific, the acoustic wave resonator S4a corresponds to a first acoustic wave resonator, the acoustic wave resonator S4b corresponds to a second acoustic wave resonator, and the acoustic wave resonator S4c corresponds to a third acoustic wave resonator. Hereinafter, the acoustic wave resonator S4a will be described as the first acoustic wave resonator S4a, the acoustic wave resonator S4b will be described as the second acoustic wave resonator S4b, and the acoustic wave resonator S4c will be described as the third acoustic wave resonator S4c. An average electrode finger pitch of the second acoustic wave resonator S4b is smallest among average electrode finger pitches of the first to third acoustic wave resonators S4a to S4c, and the second acoustic wave resonator S4b is physically interposed between the first acoustic wave resonator S4a and the third acoustic wave resonator S4c.

The number of acoustic wave resonators is not limited to three. A characteristic series arm resonator according to a preferred embodiment of the present invention only needs to include n (n is a natural number) acoustic wave resonators. The n acoustic wave resonators only need to be connected in series in an order of first, second, . . . , and nth acoustic wave resonators. Further, the n acoustic wave resonators only need to include an mth acoustic wave resonator (m is a natural number of 1<m<n), and an electrode finger pitch of the mth acoustic wave resonator only needs to be smallest among electrode finger pitches of the n acoustic wave resonators. In the present preferred embodiment, n=3 and m=2.

Preferably, the n acoustic wave resonators are disposed on an input end side in the series arm.

As illustrated in FIG. 3, the series arm resonator S4 is provided on the piezoelectric substrate 7. The series arm resonator S4 includes the first acoustic wave resonator S4a to the third acoustic wave resonator S4c as illustrated in FIG. 5. On the piezoelectric substrate 7, the second acoustic wave resonator S4b is physically interposed between the first acoustic wave resonator S4a and the third acoustic wave resonator S4c.

A resonant frequency of the second acoustic wave resonator S4b is located outside a pass band. To be more specific, the resonant frequency of the second acoustic wave resonator S4b is located in a frequency band higher than the pass band. The first to third acoustic wave resonators S4a, S4b, and S4c satisfy the following relationship: a capacitance of second acoustic wave resonator S4b=number of pairs of electrode fingers×intersecting width<capacitances of first and third acoustic wave resonators S4a and S4c. In this case, areas of the first and third acoustic wave resonators S4a and S4c, which generate large amounts of heat, are larger than when the first to third acoustic wave resonators have the same resonant frequency and the same capacitance. Therefore, a heat generation density is lowered and the electric power handling capability can be enhanced. Further, attenuation in the frequency band higher than the pass band can be improved without degrading attenuation in the pass band.

In the present preferred embodiment, the electrode finger pitch P in the second acoustic wave resonator S4b is smallest among the electrode finger pitches in the first to third acoustic wave resonators S4a to S4c.

Therefore, the acoustic wave filter 2 can achieve effectively enhanced electric power handling capability. A reason for this is as follows. In the series arm resonator S4, the first to third acoustic wave resonators S4a to S4c are connected in series. Since the electrode finger pitch of the second acoustic wave resonator S4b is smallest, power consumption, that is, an amount of heat generation, in the second acoustic wave resonator S4b is smallest among the first to third acoustic wave resonators S4a to S4c. Therefore, by physically interposing the second acoustic wave resonator S4b, which is less likely to generate heat, between the first and third acoustic wave resonators S4a and S4c, power consumption per unit area in the series arm resonator S4 can be reduced, thus enhancing the electric power handling capability.

No circuit elements other than the first to third acoustic wave resonators S4a to S4c are connected between the first and third acoustic wave resonators S4a and S4c and the second acoustic wave resonator S4b. Further, wires connecting the first and third acoustic wave resonators S4a and S4c to the second acoustic wave resonator S4b are not connected to the ground potential. Therefore, heat dissipation from the second acoustic wave resonator S4b tends to be insufficient. In such a case, preferred embodiments of the present invention is particularly suitable. Here, multiple wires connecting acoustic wave resonators are collectively referred to as a connection node. Similar to the above, a preferred embodiment of the present invention is particularly suitable when no circuit elements other than the n acoustic wave resonators are connected to the connection node connecting the n acoustic wave resonators, and the connection node is not connected to the ground potential.

The acoustic wave filter 3 is a ladder filter including series arm resonators S11 to S15 and parallel arm resonators P11 to P14. Also in the acoustic wave filter 3, although not limited, the series arm resonators S11 to S15 and the parallel arm resonators P11 to P14 include acoustic wave resonators. In the acoustic wave filter 3 as a reception filter, an inductor L4 is connected between the parallel arm resonator P14 and the ground potential. An inductor L5 is connected between the reception terminal 6 and the ground potential.

A circuit configuration of the acoustic wave filter 3 is not limited, and may be any other band-pass filter other than the ladder filter. The acoustic wave filter 3 may be a band-pass filter other than the acoustic wave filter.

Figure 6:
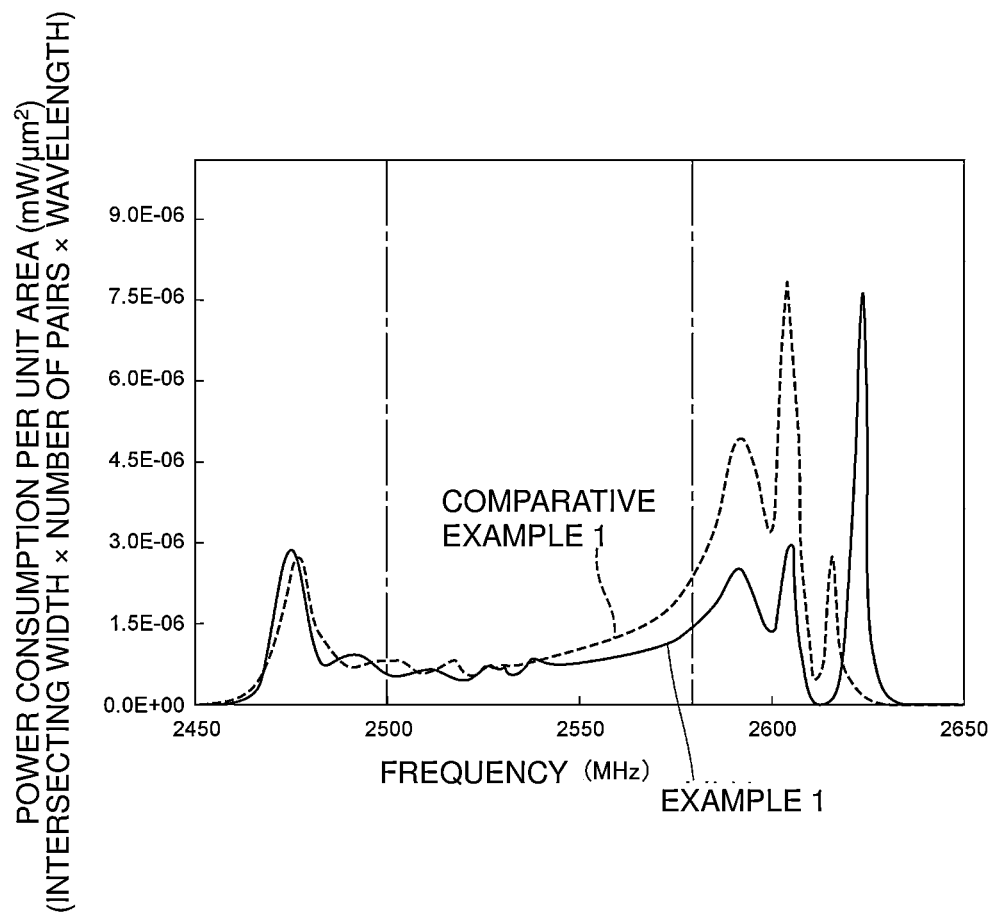
FIG. 6 is a graph showing a relationship between frequency and power consumption per unit area for an acoustic wave filter of Example 1 and a relationship between frequency and power consumption per unit area for an acoustic wave filter of Comparative Example 1.

Next, FIG. 6 shows a relationship between frequency and power consumption per unit area for an acoustic wave filter of Example 1 in the acoustic wave filter 2 according to the first preferred embodiment and a relationship between frequency and power consumption per unit area for an acoustic wave filter of Comparative Example 1.

In Example 1, for the first and third acoustic wave resonators S4a and S4c, wavelengths determined by the electrode finger pitches of the IDT electrodes were set to 1.5374 μm, and wavelengths determined by the electrode finger pitches of the reflectors were also set to the same value. For the second acoustic wave resonator S4b, a wavelength determined by the electrode finger pitch was set to about 1.5297 μm, and a wavelength determined by the electrode finger pitch of the reflectors was also set to the same value.

In Comparative Example 1, a wavelength determined by the electrode finger pitch for the second acoustic wave resonator S4b was set to be equal to the wavelengths determined by the electrode finger pitches for the first and third acoustic wave resonators S4a and S4c, that is, 1.5374 μm. Other configurations of Comparative Example 1 were the same as those of Example 1.

In FIG. 6, a solid line indicates a result of Example 1, and a dashed line indicates a result of Comparative Example 1. Long dashed short dashed lines in FIG. 6 indicate end portions of the pass band in the acoustic wave filter 2. Note that the pass band is not less than about 2500 MHz and not more than about 2580 MHz. As is clear from FIG. 6, it can be seen that, compared to Comparative Example 1, in Example 1, the power consumption is significantly smaller than that of Comparative Example 1 on a high-frequency side in the pass band and in a frequency band higher than the pass band. That is, it can be seen that, in a range of approximately about 2550 MHz to about 2620 MHz, in Example 1, the power consumption can be significantly reduced, thus enhancing the electric power handling capability. In particular, it can be seen that the power consumption can be significantly reduced at and near about 2575 MHz, which is an anti-resonant frequency at which a large power is applied.

Therefore, the acoustic wave filter 2 can achieve effectively enhanced electric power handling capability as compared with existing acoustic wave filters.

Figure 2:
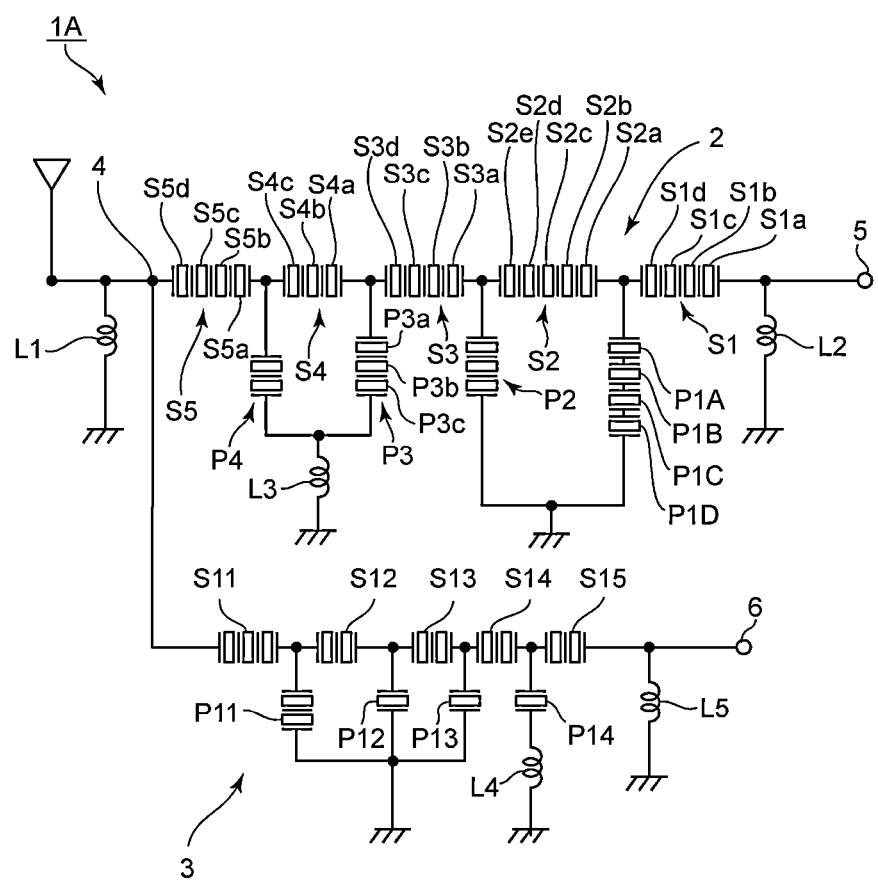
FIG. 2 is a circuit diagram illustrating a modification of the composite filter device including the acoustic wave filter according to the first preferred embodiment of the present invention.

FIG. 2 is a circuit diagram illustrating a modification of the acoustic wave filter 2 in the composite filter device 1 of the first preferred embodiment. In this modification, the parallel arm resonator P1 includes an acoustic wave resonator P1A, an acoustic wave resonator P1B, an acoustic wave resonator P1C, and an acoustic wave resonator P1D that are connected in series. Here, the acoustic wave resonator P1B is a first acoustic wave resonator, the acoustic wave resonator P1C is a second acoustic wave resonator, and the acoustic wave resonator P1D is a third acoustic wave resonator. Therefore, four (n=4) acoustic wave resonators are connected in series in the parallel arm, and three (m=3) acoustic wave resonators P1B to P1D are connected in series. Also in this case, an electrode finger pitch of the third acoustic wave resonator P1D, which is one of m acoustic wave resonators, only needs to be largest among the four acoustic wave resonators P1A, P1B, P1C, and P1D. In this case, an anti-resonant frequency of the fourth acoustic wave resonator P1D is preferably located in a frequency band lower than a pass band of the acoustic wave filter.

Figure 7:
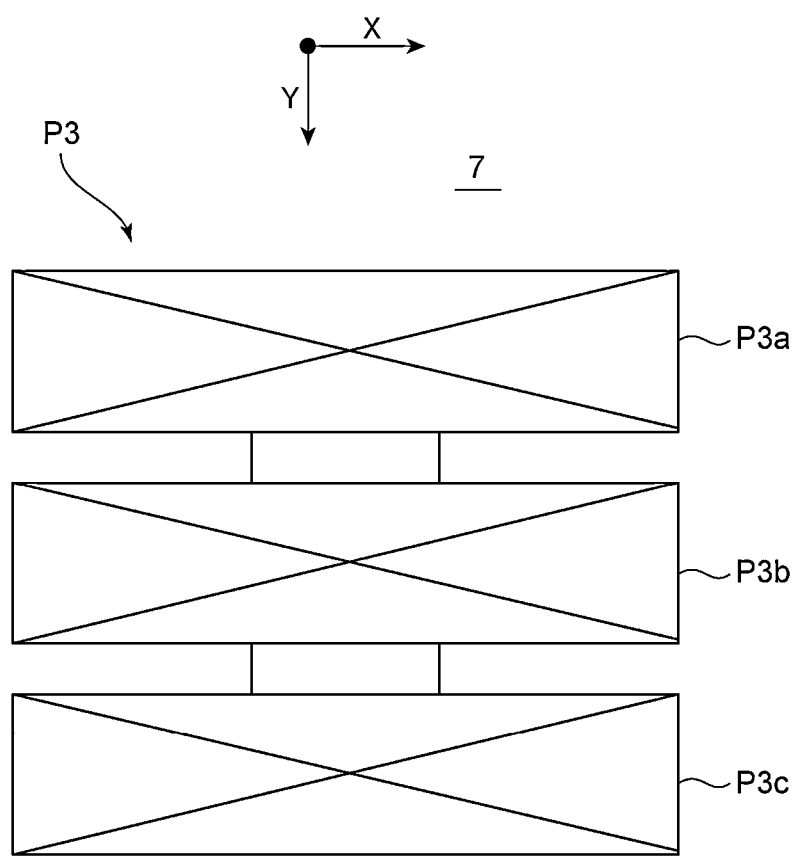
FIG. 7 is a schematic plan view for explaining a positional relationship between first to third acoustic wave resonators in an acoustic wave filter according to a second preferred embodiment of the present invention.

FIG. 7 is a schematic plan view for explaining a positional relationship between first to third acoustic wave resonators in an acoustic wave filter according to a second preferred embodiment of the present invention.

As illustrated in FIG. 7, in the second preferred embodiment, a third parallel arm resonator P3 includes first to third acoustic wave resonators P3a to P3c connected in series. In the parallel arm resonator P3, a configuration in which the first to third acoustic wave resonators P3a to P3c are connected in series can enhance the electric power handling capability. In addition, an electrode finger pitch of the second acoustic wave resonator P3b is largest among electrode finger pitches of the first to third acoustic wave resonators P3a to P3c, and the second acoustic wave resonator P3b is interposed between the first and third acoustic wave resonators P3a and P3c, thus more effectively enhancing the electric power handling capability.

The second acoustic wave resonator P3b is interposed between the first acoustic wave resonator P3a and the third acoustic wave resonator P3c in a Y direction orthogonal to an acoustic wave propagation direction X.

In the acoustic wave filter of the second preferred embodiment, the third parallel arm resonator P3 is configured as described above, and other configurations are the same as those of Comparative Example 1 described above. That is, a series arm resonator S4 is the same as that of Comparative Example 1 described above.

It will be described with reference to FIG. 8 that the electric power handling capability can also be effectively enhanced in the second preferred embodiment.

Figure 8:
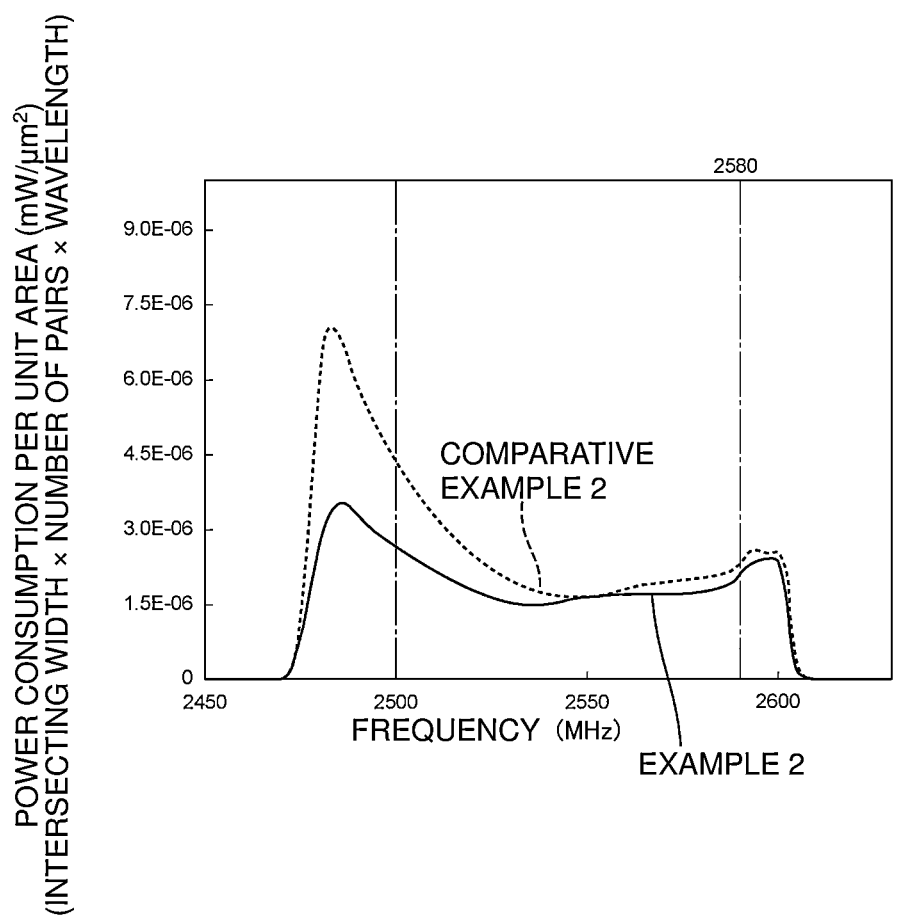
FIG. 8 is a graph showing a relationship between frequency and power consumption per unit area for an acoustic wave filter of Example 2 and a relationship between frequency and power consumption per unit area for an acoustic wave filter of Comparative Example 2.

FIG. 8 is a graph showing a relationship between frequency and power consumption per unit area for an acoustic wave filter of Example 2 in the acoustic wave filter of the second preferred embodiment and a relationship between frequency and power consumption per unit area for an acoustic wave filter of Comparative Example 2. Also in FIG. 8, long dashed short dashed lines indicate a lower limit and an upper limit of a pass band.

In Example 2, for the first and third acoustic wave resonators P3a and P3c, wavelengths determined by electrode finger pitches were about 1.5858 μm. That is, the electrode finger pitch is about 0.7929 (=about 1.5858/2) μm. The same pitch was used for reflectors.

On the other hand, for the second acoustic wave resonator P3b, a wavelength determined by an electrode finger pitch was set to about 1.5866 μm, that is, an electrode finger pitch was set to about 0.7933 μm, and the electrode finger pitch for reflectors was also set to the same value.

In Comparative Example 2, for the first to third acoustic wave resonators P3a to P3c, electrode finger pitches were all the same, that is, wavelengths determined by the electrode finger pitches were 1.5858 μm. Other configurations of Comparative Example 2 were the same as those of Example 2.

In FIG. 8, a solid line indicates a result of Example 2, and a dashed line indicates a result of Comparative Example 2.

As is clear from FIG. 8, it can be seen that, in the parallel arm resonator P3, the power consumption can be sufficiently reduced as compared with Comparative Example 2 at a resonant frequency at which the largest power is applied in the pass band. Therefore, it can be seen that the acoustic wave filter of the second preferred embodiment can also achieve effectively enhanced electric power handling capability.

The resonant frequencies and the anti-resonant frequencies of the first to third acoustic wave resonators S4a to S4c are as shown in Table 1 below.

TABLE 1

| | Wavelength (μm) | Resonant frequency (MHz) | Anti-resonant frequency (MHz) |
|---|---|---|---|
| First acoustic wave resonator S4a | 1.5374 | 2527.69 | 2617.69 |
| First acoustic wave resonator S4b | 1.5297 | 2538.94 | 2631.85 |
| First acoustic wave resonator S4c | 1.5374 | 2527.69 | 2617.69 |

The resonant frequencies and the anti-resonant frequencies of the first to third acoustic wave resonators P3a to P3c in the parallel arm resonator P3 are as shown in Table 2 below.

TABLE 2

| | Wavelength (μm) | Resonant frequency (MHz) | Anti-resonant frequency (MHz) |
|---|---|---|---|
| First acoustic wave resonator P3a | 1.5858 | 2457.51 | 2541.47 |
| First acoustic wave resonator P3b | 1.5866 | 2455.74 | 2539.99 |
| First acoustic wave resonator P3c | 1.5858 | 2457.51 | 2541.47 |

The number of acoustic wave resonators is not limited to three. Also in the second preferred embodiment, the series arm resonator only needs to include n (n is a natural number) acoustic wave resonators. In the parallel arm, n acoustic wave resonators only need to be connected in series in an order of first, second, . . . , and nth acoustic wave resonators. Further, the n acoustic wave resonators only need to include an mth acoustic wave resonator (m is a natural number of 1<m<n), and an electrode finger pitch of the mth acoustic wave resonator only needs to be largest among electrode finger pitches of the n acoustic wave resonators. In the present preferred embodiment, n=3 and m=2.

Figure 9:
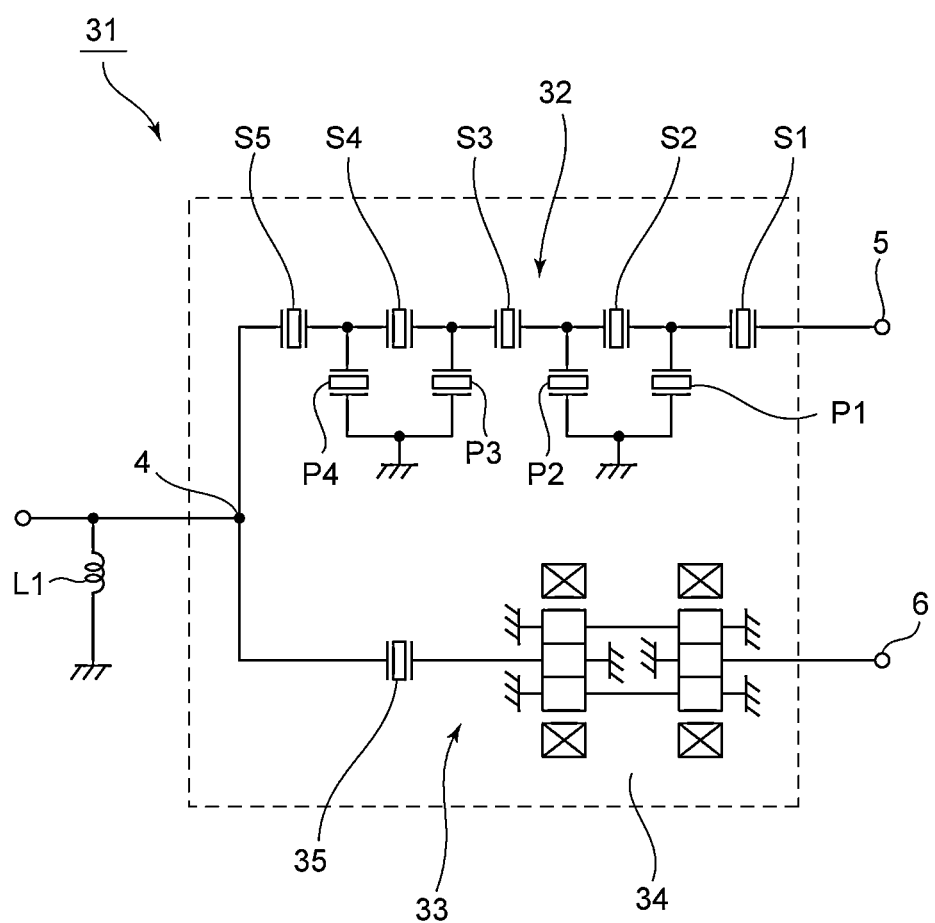
FIG. 9 is a circuit diagram of a composite filter device including an acoustic wave filter according to a third preferred embodiment of the present invention.
Figure 10:
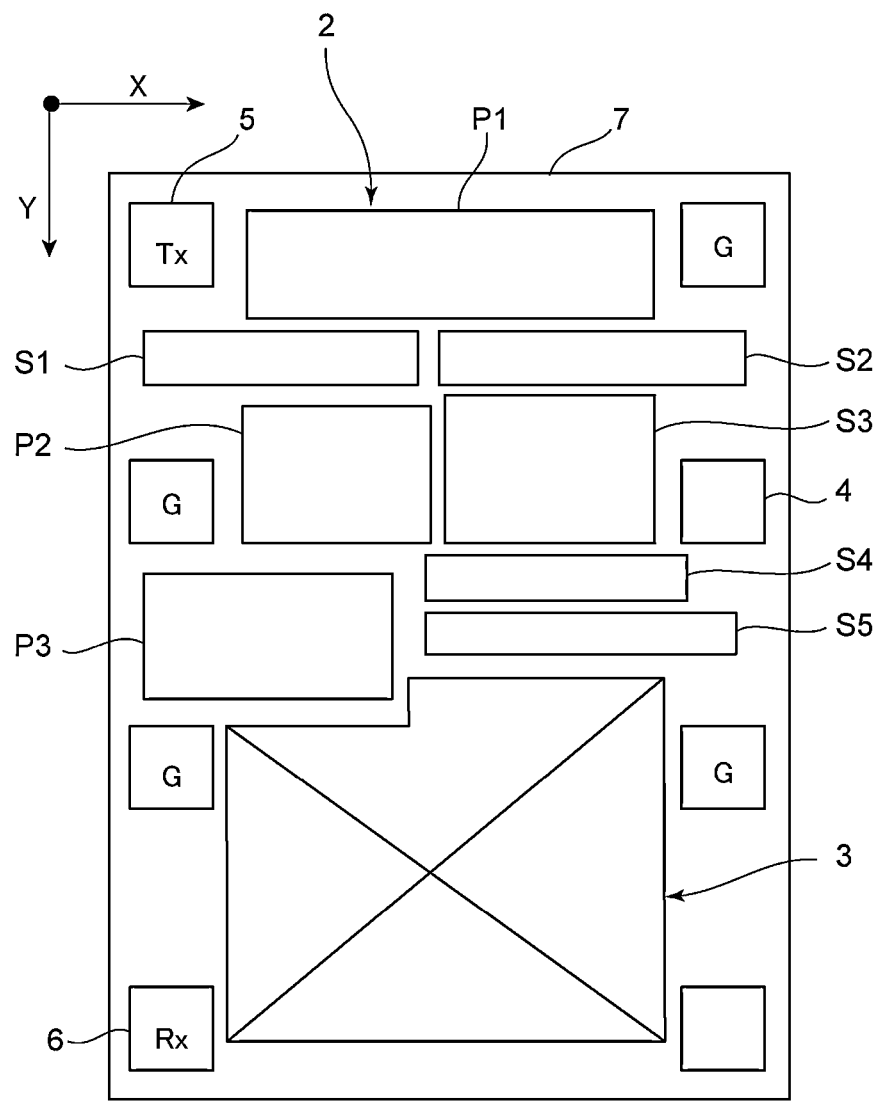
FIG. 10 is a schematic plan view of the composite filter device including the acoustic wave filter according to the third preferred embodiment of the present invention.

FIG. 9 is a circuit diagram of a composite filter device including an acoustic wave filter according to a third preferred embodiment of the present invention, and FIG. 10 is a schematic plan view thereof. In FIG. 10, a layout of resonators is illustrated, and wirings are omitted.

As illustrated in FIG. 9, a composite filter device 31 includes a common terminal 4 that is connected to an antenna, a transmission terminal 5, and a reception terminal 6, similar to the composite filter device 1. An acoustic wave filter 32 as a transmission filter is connected between the common terminal 4 and the transmission terminal 5. The acoustic wave filter 32 is an acoustic wave filter according to the third preferred embodiment of the present invention. An acoustic wave filter 33 as a reception filter is connected between the common terminal 4 and the reception terminal 6.

In the acoustic wave filter 32, series arm resonators S1 to S5 are provided in a series arm connecting the transmission terminal 5 and the common terminal 4. Parallel arm resonators P1 to P4 are connected between the series arm and the ground potential. A difference from the acoustic wave filter 2 of the first preferred embodiment is that each of the series arm resonators S1 to S5 is a single acoustic wave resonator and is not split into multiple acoustic wave resonators. Similarly, each of the parallel arm resonators P1 to P4 is a single acoustic wave resonator in the acoustic wave filter 32.

In the acoustic wave filter 32, which is a ladder filter, the series arm resonators S2 to S4 correspond to first to third acoustic wave resonators.

That is, an electrode finger pitch of the series arm resonator S3, which is the second acoustic wave resonator, is smaller than electrode finger pitches of the series arm resonators S2 and S4, which are the first and third acoustic wave resonators. As illustrated in FIG. 10, the series arm resonator S3 is physically interposed between the series arm resonator S2 and the series arm resonator S4 on a piezoelectric substrate 7 in a Y direction. That is, the series arm resonator S3 is interposed between the series arm resonator S2 and the series arm resonator S4 in the direction Y orthogonal to an acoustic wave propagation direction X. A resonant frequency of the series arm resonator S3 is located outside a pass band of the acoustic wave filter 32. To be more specific, the resonant frequency of the series arm resonator S3 is located in a frequency band higher than the pass band.

In the acoustic wave filter 32, since the series arm resonators S2 to S4 are configured as described above, an amount of heat generated by the series arm resonator S3 is smaller than an amount of heat generated by each of the series arm resonators S2 and S4. Therefore, the amount of heat generation can be reduced in a portion where the series arm resonators S2 to S4 are disposed on the piezoelectric substrate 7, thus enhancing the electric power handling capability.

As described above, preferred embodiments of the present invention are not limited to a structure in which one acoustic wave resonator is split to include first to third acoustic wave resonators connected in series, but can be widely applied to structures including first to third acoustic wave resonators connected in series.

In the composite filter device 31, the acoustic wave filter 33 as a reception filter has a structure in which a longitudinally coupled resonator acoustic wave filter 34 and an acoustic wave resonator 35 are connected. A circuit configuration of the acoustic wave filter 33 is not limited.

Figure 11:
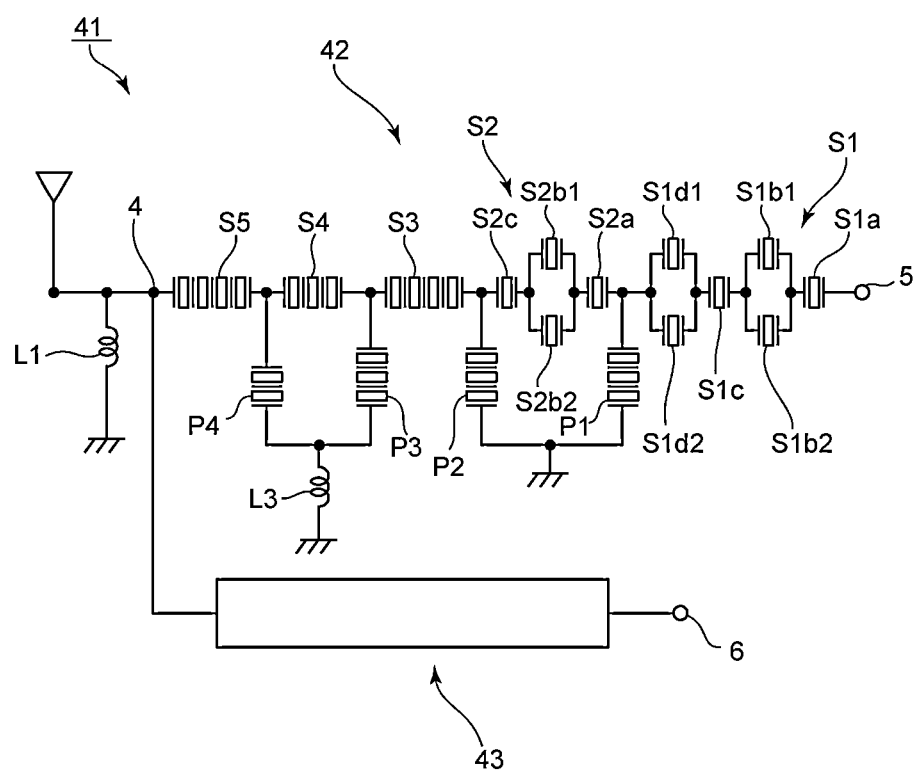
FIG. 11 is a circuit diagram of a composite filter device according to a fourth preferred embodiment of the present invention.

FIG. 11 is a circuit diagram of a composite filter device including an acoustic wave filter according to a fourth preferred embodiment of the present invention. In a composite filter device 41, an acoustic wave filter 42 of the fourth preferred embodiment is connected between a common terminal 4 and a transmission terminal 5. An acoustic wave filter 43 as a reception filter is connected between the common terminal 4 and the reception terminal 6. In the acoustic wave filter 42, series arm resonators S1 to S5 are arranged in order from a transmission terminal 5 side in a series arm connecting the common terminal 4 and the transmission terminal 5. Here, the series arm resonator S1 includes an acoustic wave resonator S1$a$, acoustic wave resonators S1$b$1 and S1$b$2 connected in parallel, an acoustic wave resonator S1$c$, and acoustic wave resonators S1$d$1 and S1$d$2 connected in parallel.

The series arm resonator S2 includes an acoustic wave resonator S2$a$ corresponding to a first acoustic wave resonator in the present invention, acoustic wave resonators S2$b$1 and S2$b$2 corresponding to second acoustic wave resonators, and a third acoustic wave resonator S2$c$. The acoustic wave resonators S2$b$1 and S2$b$2 are connected in parallel.

The series arm resonators S3 to S5 have a structure in which multiple acoustic wave resonators are connected in series. Parallel arm resonators P1 to P4 also have a structure in which multiple acoustic wave resonators are connected in series. Ground potential side end portions of the parallel arm resonators P3 and P4 are connected in common to the ground potential via an inductor L3.

In the composite filter device 41, in the series arm resonator S2, electrode finger pitches of the second acoustic wave resonators S2$b$1 and S2$b$2 are smaller than electrode finger pitches of the first and third acoustic wave resonators S2$a$ and S2$c$. The electrode finger pitches of the first acoustic wave resonator S2$a$ and the third acoustic wave resonator S2$c$ may be equal or different.

The electrode finger pitches of the second acoustic wave resonators S2$b$1 and S2$b$2 may be equal or different. However, the electrode finger pitches of the second acoustic wave resonators S2$b$1 and S2$b$2 need to be smaller than the electrode finger pitches of the first and third acoustic wave resonators S2$a$ and S2$c$ as described above.

Figure 13:
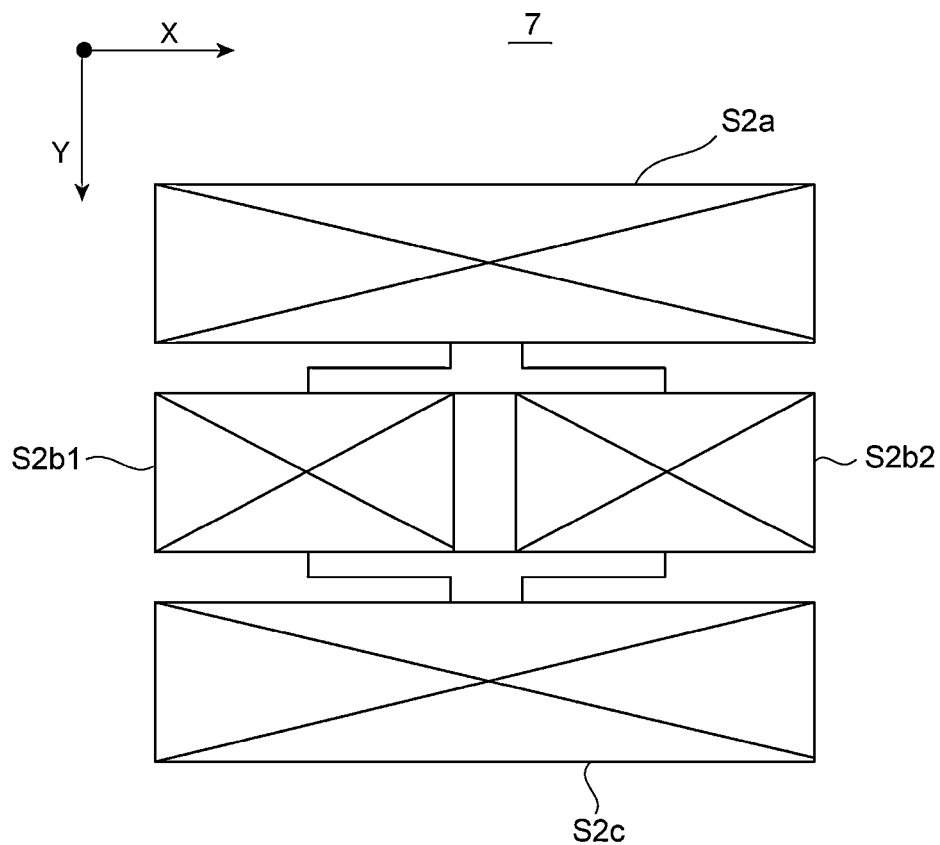
FIG. 13 is a schematic plan view for explaining a positional relationship between first to third acoustic wave resonators in an acoustic wave filter according to the fourth preferred embodiment of the present invention.

FIG. 13 is a schematic plan view for explaining a positional relationship between the acoustic wave resonators S2$a$, S2$b$1, S2$b$2, and S2$c$ in the acoustic wave filter according to the fourth preferred embodiment. On a piezoelectric substrate 7, the acoustic wave resonators S2$b$1 and S2$b$2, which are the second acoustic wave resonators, are physically interposed between the first acoustic wave resonator S2$a$ and the third acoustic wave resonator S2$c$ in a Y direction orthogonal to an acoustic wave propagation direction X. Resonant frequencies of the second acoustic wave resonators S2$b$1 and S2$b$2 are located in a frequency band higher than a pass band of the acoustic wave filter 42. That is, the resonant frequencies of the second acoustic wave resonators S2$b$1 and S2$b$2 are located outside the pass band.

Since the acoustic wave filter 42 is configured as described above, an amount of heat generated in the series arm resonator S2 can be reduced, thus enhancing the electric power handling capability. That is, the second acoustic wave resonators S2$b$1 and S2$b$2, which are less likely to generate heat, are interposed between the first and third acoustic wave resonators S2a and S2c. Therefore, the amount of heat generation can be reduced and the electric power handling capability can be enhanced.

The second acoustic wave resonator, such as the second acoustic wave resonators S2b1 and S2b2, may be split so that multiple acoustic wave resonators are connected in parallel. In this case, the number of divisions may be three or more.

In the first to fourth preferred embodiments, the first and third acoustic wave resonators may also have a structure split so that multiple acoustic wave resonators are connected in parallel.

Figure 12:
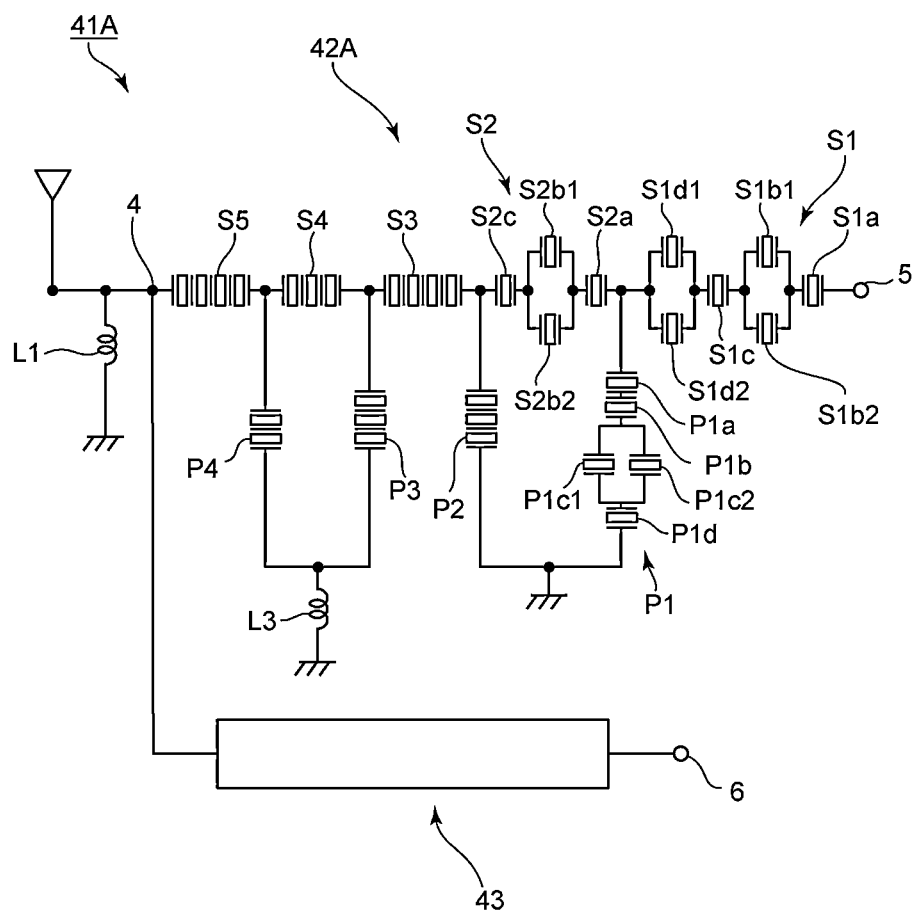
FIG. 12 is a circuit diagram of a composite filter device including an acoustic wave filter according to a fifth preferred embodiment of the present invention.

FIG. 12 is a circuit diagram of a composite filter device including an acoustic wave filter according to a fifth preferred embodiment of the present invention. A composite filter device 41A illustrated in FIG. 12 has substantially the same configuration as the composite filter device 41 illustrated in FIG. 11. A difference is that acoustic wave resonators P1a, P1b, P1c1, P1c2, and P1d are used instead of the parallel arm resonator P1 illustrated in FIG. 11. The acoustic wave resonators P1c1 and P1c2 are first and second split resonators and are connected in parallel. In this structure, the acoustic wave resonator P1a, the acoustic wave resonator P1b, the acoustic wave resonators P1c1 and P1c2 connected in parallel, and the acoustic wave resonator P1d are connected in series. Here, the acoustic wave resonator P1b corresponds to a first acoustic wave resonator, the acoustic wave resonators P1c1 and P1c2, which are the first and second split resonators, correspond to second acoustic wave resonators, and the acoustic wave resonator P1d corresponds to a third acoustic wave resonator.

The composite filter device 41A is otherwise similar to the composite filter device 41 illustrated in FIG. 11.

As in the composite filter device 41A, in an acoustic wave filter 42A, the first to third parallel arm resonators may be connected in a parallel arm. Electrode finger pitches of the second acoustic wave resonators P1c1 and P1c2 are larger than electrode finger pitches of the first and third acoustic wave resonators P1b and P1d. The electrode finger pitches of the first acoustic wave resonator P1b and the third acoustic wave resonator P1d may be equal or different. The electrode finger pitches of the acoustic wave resonator P1c1 and the acoustic wave resonator P1c2 may be equal or different. In a preferred embodiment of the present invention, the first to third acoustic wave resonators may be used in the parallel arm resonator as described above.

Figure 14:
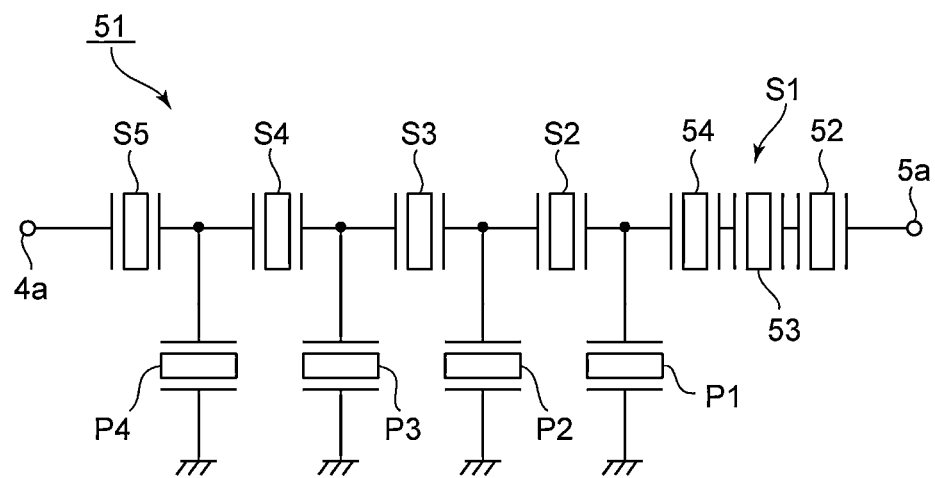
FIG. 14 is a circuit diagram of an acoustic wave filter according to a sixth preferred embodiment of the present invention.

FIG. 14 is a circuit diagram of an acoustic wave filter according to a sixth preferred embodiment. An acoustic wave filter 51 is a ladder filter used as a transmission filter. Here, multiple series arm resonators S1 to S5 are disposed between an input end 5a and an output end 4a. In multiple parallel arms connecting a series arm and the ground potential, parallel arm resonators P1 to P4 are provided. A preferred embodiment of the present invention may be applied to a single acoustic wave filter 51 such as the acoustic wave filter 51 instead of a composite filter device. Here, as in the fourth preferred embodiment, the series arm resonators S2 to S4 are first to third acoustic wave resonators, thus enhancing the electric power handling capability.

Note that in the acoustic wave filter 51, instead of the series arm resonators S2 to S4, acoustic wave resonators 52 to 54 of the series arm resonator S1 may be used as the first to third acoustic wave resonators, thus enhancing the electric power handling capability.

That is, in preferred embodiments of the present invention, positions of the first to third acoustic wave resonators connected in series are not limited.

Figure 15:
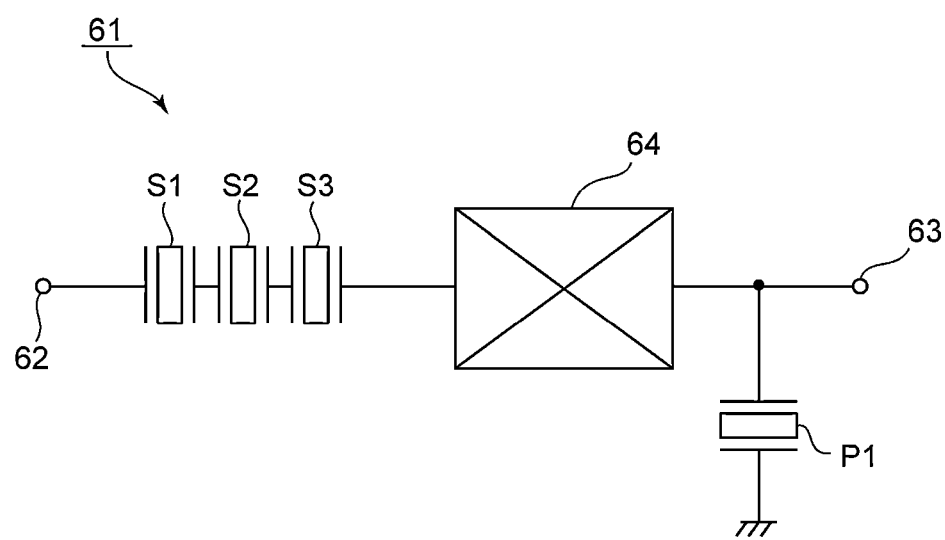
FIG. 15 is a circuit diagram of an acoustic wave filter according to a seventh preferred embodiment of the present invention.

FIG. 15 is a circuit diagram of an acoustic wave filter according to a seventh preferred embodiment of the present invention. In an acoustic wave filter 61, series arm resonators S1 to S3 and a longitudinally coupled resonator acoustic wave filter 64 are connected in series in a series arm connecting an input end 62 and an output end 63. A parallel arm resonator P1 is connected to a parallel arm connecting the series arm and the ground potential. Thus, also in the acoustic wave filter 61 including the longitudinally coupled resonator acoustic wave filter 64, for example, the series arm resonators S1 to S3 are first to third acoustic wave resonators, enhancing the electric power handling capability.

That is, the first to third acoustic wave resonators in preferred embodiments of the present invention are not limited to ladder filters.

Figure 16:
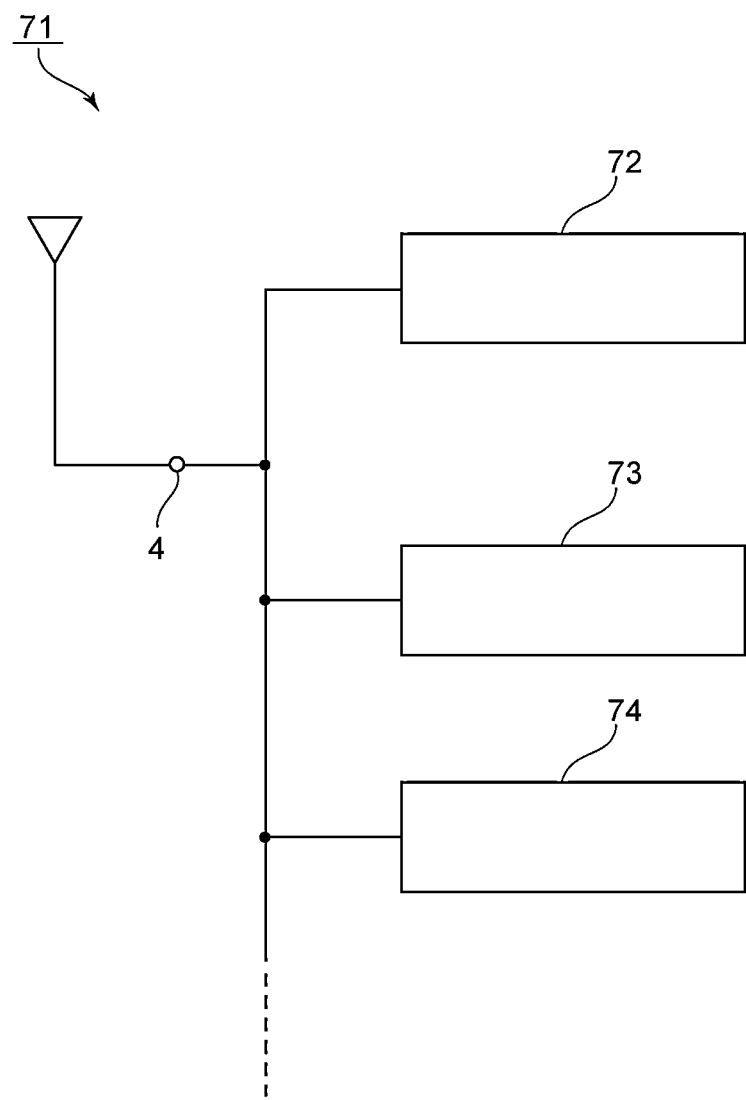
FIG. 16 is a circuit diagram of a composite filter device according to an eighth preferred embodiment of the present invention.

FIG. 16 is a circuit diagram of a composite filter device 71 according to an eighth preferred embodiment of the present invention. The composite filter device 71 includes a common terminal 4 that is connected to an antenna. One end of each of three or more band-pass filters 72 to 74 (and others) is connected to the common terminal 4. By using an acoustic wave filter according to a preferred embodiment of the present invention in at least one of the three or more band-pass filters 72 to 74 (and others), the electric power handling capability can be enhanced.

That is, a composite filter device according to a preferred embodiment of the present invention can be applied not only to a duplexer including a transmission filter and a reception filter but also to various composite filter devices such as a multiplexer in which the one ends of three or more band-pass filters are connected in common.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
    an input end;
    an output end; and
    a series arm connecting the input end and the output end; wherein
    the series arm includes n acoustic wave resonators connected in series in an order of first, second, to nth acoustic wave resonators, where n is a natural number;
    each of the n acoustic wave resonators includes multiple electrode fingers;
    the n acoustic wave resonators include an mth acoustic wave resonator, where m is a natural number of 1<m<n;
    the mth acoustic wave resonator is interposed between the first and nth acoustic wave resonators; and
    an electrode finger pitch of the mth acoustic wave resonator is smallest among electrode finger pitches of the n acoustic wave resonators.

2. The acoustic wave filter according to claim 1, wherein the n acoustic wave resonators are on an input end side in the series arm.

3. The acoustic wave filter according to claim 1, wherein a resonant frequency of the mth acoustic wave resonator is located outside a pass band of the acoustic wave filter.

4. The acoustic wave filter according to claim 1, wherein no circuit elements other than the n acoustic wave resonators are connected to a connection node connecting the n acoustic wave resonators, and the connection node connecting the n acoustic wave resonators is not connected to a ground potential.

5. The acoustic wave filter according to claim 1, wherein the mth acoustic wave resonator includes a first split resonator and a second split resonator connected in parallel, and electrode finger pitches of the first split resonator and the second split resonator are both smaller than electrode finger pitches of the first acoustic wave resonator and the nth acoustic wave resonator.

6. An acoustic wave filter comprising:
an input end;
an output end; and
a series arm connecting the input end and the output end; wherein
the series arm includes n acoustic wave resonators connected in series in an order of first, second, to nth acoustic wave resonators, where n is a natural number;
each of the n acoustic wave resonators includes multiple electrode fingers;
the n acoustic wave resonators include an mth acoustic wave resonator, where m is a natural number of 1<m<n;
the mth acoustic wave resonator is interposed between the first and nth acoustic wave resonators; and
an electrode finger pitch of the mth acoustic wave resonator is largest among electrode finger pitches of the n acoustic wave resonators.

7. The acoustic wave filter according to claim 6, wherein a resonant frequency of the mth acoustic wave resonator is located outside a pass band of the acoustic wave filter.

8. The acoustic wave filter according to claim 6, wherein no circuit elements other than the n acoustic wave resonators are connected to a connection node connecting the n acoustic wave resonators, and the connection node connecting the n acoustic wave resonators is not connected to a ground potential.

9. The acoustic wave filter according to claim 6, wherein the mth acoustic wave resonator includes a first split resonator and a second split resonator connected in parallel, and electrode finger pitches of the first split resonator and the second split resonator are both larger than electrode finger pitches of the first acoustic wave resonator and the nth acoustic wave resonator.

10. A composite filter device comprising:
the acoustic wave filter according to claim 1; and
at least one band-pass filter with a pass band different from a pass band of the acoustic wave filter; wherein one end of the acoustic wave filter and one end of the at least one band-pass filter are connected in common.

11. The composite filter device according to claim 10, wherein the n acoustic wave resonators are on an input end side in the series arm.

12. The composite filter device according to claim 10, wherein a resonant frequency of the mth acoustic wave resonator is located outside a pass band of the acoustic wave filter.

13. The composite filter device according to claim 10, wherein no circuit elements other than the n acoustic wave resonators are connected to a connection node connecting the n acoustic wave resonators, and the connection node connecting the n acoustic wave resonators is not connected to a ground potential.

14. The composite filter device according to claim 10, wherein the mth acoustic wave resonator includes a first split resonator and a second split resonator connected in parallel, and electrode finger pitches of the first split resonator and the second split resonator are both smaller than electrode finger pitches of the first acoustic wave resonator and the nth acoustic wave resonator.

15. A composite filter device comprising:
the acoustic wave filter according to claim 6; and
at least one band-pass filter with a pass band different from a pass band of the acoustic wave filter; wherein one end of the acoustic wave filter and one end of the at least one band-pass filter are connected in common.

16. The composite filter device according to claim 15, wherein a resonant frequency of the mth acoustic wave resonator is located outside a pass band of the acoustic wave filter.

17. The composite filter device according to claim 15, wherein no circuit elements other than the n acoustic wave resonators are connected to a connection node connecting the n acoustic wave resonators, and the connection node connecting the n acoustic wave resonators is not connected to a ground potential.

18. The composite filter device according to claim 15, wherein the mth acoustic wave resonator includes a first split resonator and a second split resonator connected in parallel, and electrode finger pitches of the first split resonator and the second split resonator are both larger than electrode finger pitches of the first acoustic wave resonator and the nth acoustic wave resonator.

* * * * *